United States Patent [19]

Shou et al.

[11] Patent Number: 5,734,583

[45] Date of Patent: Mar. 31, 1998

[54] CAPACITANCE FORMING METHOD

[75] Inventors: Guoliang Shou; Kazunori Motohashi; Makoto Yamamoto; Sunao Takatori, all of Tokyo, Japan

[73] Assignees: Yozan Inc.; Sharp Kabushiki Kaisha

[21] Appl. No.: 536,326

[22] Filed: Sep. 29, 1995

[30] Foreign Application Priority Data

| Sep. 30, 1994 | [JP] | Japan | 6-261617 |
| Sep. 30, 1994 | [JP] | Japan | 6-261623 |
| Oct. 11, 1994 | [JP] | Japan | 6-271687 |

[51] Int. Cl.⁶ .................................................. G06F 17/50
[52] U.S. Cl. ........................................ 364/491; 364/488
[58] Field of Search ............................. 364/488, 489, 364/490, 491, 468

[56] References Cited

U.S. PATENT DOCUMENTS

| 4,694,403 | 9/1987 | Nomura | 364/488 |
| 5,212,653 | 5/1993 | Tanaka | 364/491 |
| 5,245,543 | 9/1993 | Smayling et al. | 364/468 |
| 5,278,105 | 1/1994 | Eden et al. | 437/250 |
| 5,313,090 | 5/1994 | Monikawa | 257/577 |
| 5,459,093 | 10/1995 | Kuroda et al. | 437/51 |
| 5,471,090 | 11/1995 | Deutch et al. | 257/734 |

FOREIGN PATENT DOCUMENTS

| 0 186 239 | 7/1986 | European Pat. Off. |
| 58-103163 | 6/1983 | Japan |
| 05-350856 | 12/1993 | Japan |
| 7121860 | 8/1995 | Japan |

OTHER PUBLICATIONS

Kaneko et al., "A Novel Capacitor Placement Strategy in ASCCOT:Automatic Layouter for Switched Capacitor Circuits, " 1993 IEEE Int'l Symp. on Circuits and Systems, pp. 2094–2097.

Singh et al., "A Fast and Area–Efficiency BWC Array D/A and A/D Conversion Scheme", IEEE Transations on Circuits and Systems, No. 6, Jun. 1989, pp. 912–916.

"Design and Application for SC Circuit Networks", pp. 168–170, Nov. 25, 1985 published by Tokai Daigaku Shuppankai.

Takai, Tokumichi "Semiconductor Circuit Designing Technology", Mikkei BP Sha, 1993, pp. 54–60.

*Primary Examiner*—Kevin J. Teska
*Assistant Examiner*—Leigh Marie Garbowski
*Attorney, Agent, or Firm*—Cushman, Darby & Cushman IP Group of Pillsbury Madison & Sutro LLP

[57] ABSTRACT

A capacitance forming method for forming capacitances corresponding to a plurality of constant numbers within a large scale integrated circuit (LSI) comprises steps of defining a unit capacitance with a predetermined shape, defining an arrangement of a plurality of the unit capacitances of a number necessary for total capacity of capacitances to be formed in two dimension in an area of the LSI, selecting the unit capacitances of a number corresponding to the maximal capacity among capacities of the capacitances to be formed so that the selected unit capacitances are equivalently dispersed over the area, and successively selecting other of the capacitances than the capacitance of the maximal capacity in the order of capacities, and selecting the unit capacitances of a number corresponding to a capacity of each the capacitance selected so that the selected unit capacitances are equivalently dispersed over an area of the rest of the unit capacitances which have not selected yet.

8 Claims, 5 Drawing Sheets

CAPACITANCE FORMING METHOD

FIELD OF THE INVENTION

The present invention relates to a capacitance forming method, particularly to a capacitance forming method using a plurality of unit capacitances of a predetermined shape which are parallelly connected.

BACKGROUND OF THE INVENTION

The inventors of the present invention have proposed a capacitance forming method in Japanese Patent Application Hei No. 05-350856 and in U.S. patent application Ser. No. 08/262,759. As shown in FIG. 10, according to this capacitance forming method, a plurality of predetermined unit capacitances are aligned, then some unit capacitances are selected for one capacitance component so that there is no adjacent pairs of unit capacitances selected for the one capacitance component. The deviation of the unit capacitances is minimized in order to compensate the relative accuracy of capacities of different capacitance components.

By the proposed method, capacitance components consisting of a plurality of unit capacitances have good relative accuracy when the capacitance components have capacities nearly equal to one another. However, the capacities of the capacitance components are much different when the weights of digits of binary members are represented by the capacitance components. Therefore, the conventional capacitance forming method is not suited for use when the capacitive components represent weights of digits of a binary number. In the process of diffusing chemical vapor during the forming of the unit capacitances, inequalities forming is caused due to the flowing direction in the peripheral area of the alignment area of the unit capacitances, and the relative accuracy becomes lower.

SUMMARY OF THE INVENTION

The present invention solves the conventional problems and has a first purpose to provide a method for selecting a unit capacitance for capacitance components with large differences in capacity. The second purpose of the present invention is to provide a capacitance forming method without influences of the flowing of diffusion of chemical vapor.

According to the present invention, unit capacitances for a capacitance component with the largest capacity are dispersed equivalently in the area of alignment of the unit capacitances. Then, the next unit capacitances are selected from the rest of the capacitive elements as equivalent as possible, and similar selections are performed repeatedly. Then, high relative accuracy in capacities can be obtained even when there are large differences in the capacities of the capacitance components. Furthermore, capacitances of a dummy pattern are formed in the peripheral area of the alignment area of the unit capacitances. The influence of the flow of diffusion of chemical vapor is absorbed by the dummy pattern, and equivalence is kept in the unit capacitances actually used.

REFERRED EMBODIMENT OF THE INVENTION

Hereinafter the embodiment of a capacitance forming method according to the present invention is described with reference to the attached drawings.

Figure 1:
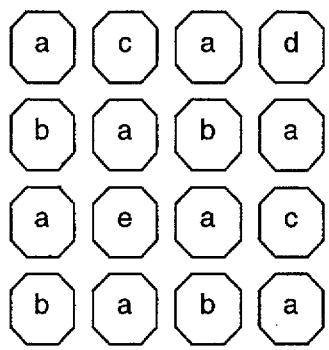
FIG. 1 is a plan view of the alignment of unit capacitances of a first embodiment according to the present invention.

FIG. 1 is a plan view showing an arrangement of unit capacitances for obtaining a capacity ratio of 8:4:2:1:1. In the arrangement, the unit capacitances are aligned in a matrix of 4×4 unit capacitances. Here, when a capacity of a unit capacitance is Cu, a capacity of a capacitance with the maximum capacity is defined as 8 Cu and capacities of the following capacitances are defined as 4 Cu, 2 Cu, Cu and Cu.

In FIG. 1, the unit capacitances are designated by references "a", "b", "c", "d" and "e". The reference "a" shows unit capacitances for a capacitance, or a capacitance component, of 8 Cu (It is called the first capacitance.). The unit capacitances "b" are for a capacitance component of 4 Cu (It is called the second capacitance.). The unit capacitances "c" are for a capacitance component of 2 Cu (It is called the third capacitance.). The unit capacitances "d" are for a capacitance component of Cu (It is called the fourth capacitance.). The unit capacitances "e" are for a capacitance component of Cu (It is called the fifth or last capacitance.). The unit capacitances of the first capacitance are arranged in a checker flag pattern. In other words, the capacitance component of the maximum capacity consists of unit capacitances arranged so that the unit capacitances are dispersed equivalently in the whole arrangement area without any adjacent pairs in the horizontal or vertical direction. Therefore, decentralization and mutual estrangement of unit capacitances are realized. Unit capacitances for the second capacitance are positioned at four corners of a horizontal square with the sides of three unit capacitances in good decentralization and estrangement similar to the first capacitance component. For the third capacitance, two unit capacitances are positioned at diagonal corners of a horizontal square with the sides of three unit capacitancies in the rest of the unit capacitances so as to be widely dispersed. There is one unit capacitance for each of the fourth and fifth capacitances, which are positioned at other diagonal corners than the corners of the third capacitance in the same square as that for the third capacitance.

As mentioned above, even when capacitance components with large differences of capacity are formed, unit capacitances for the capacitance components are equivalent in the positioning condition, so that the relative accuracy of a capacity is improved.

Figure 2:
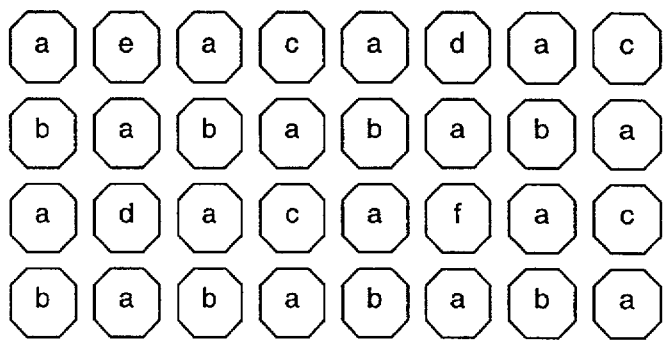
FIG. 2 is a plan view of the second embodiment.

FIG. 2 is the second embodiment of an arrangement of unit capacitances for obtaining a capacity ratio of 16:8:4:2:1:1, and the unit capacitances are arranged in a matrix of 4×8 unit capacitances. Here, when a capacity of a unit capacitance is Cu, a capacity of capacitance component with the maximum capacity is defined as 16 Cu, and capacities of the following capacitances are defined as 8 Cu, 4 Cu, 2 Cu, and Cu.

In FIG. 2, unit capacitances "a", "b", "c", "d", "e" and "f" are arranged, which are called the first, second, third, fourth, fifth and sixth capacitances, hereinafter. These capacitances are unit capacitances for capacitance components of 16 Cu, 8 Cu, 4 Cu, 2 Cu, the first Cu and the last Cu. Unit capacitances for the first capacitance are arranged in a checker flag pattern, similar to the first embodiment. Unit capacitances for the second capacitance are aligned along two horizontal lines on each of which four unit capacitances are positioned on every other unit capacitance position. The lines are departed by one unit capacitancre position from each other. For the third capacitance, four unit capacitances are positioned at corners of a horizontal rectangle with vertical sides of three unit capacitances and horizontal sides of five unit capacitances in the rest of the unit capacitances so as to be widely dispersed. The fourth capacitance consists of two unit capacitances diagonally positioned on the corner of a rectangle similar to the rectangle of the third capacitance. There is one unit capacitance for each of the fourth and fifth capacitances, which are positioned at diagonal corners other than the corners of the fourth capacitance in the same rectangle as that for the fourth capacitance. In this embodiment, the good decentralization and mutual estrangement are realized, also, for larger difference of ratio of 16:8:4:2:1:1 than that of the first embodiment.

Hereinafter the third embodiment of capacitance forming method according to the present invention is described with referring to the attached drawings.

Figure 3:
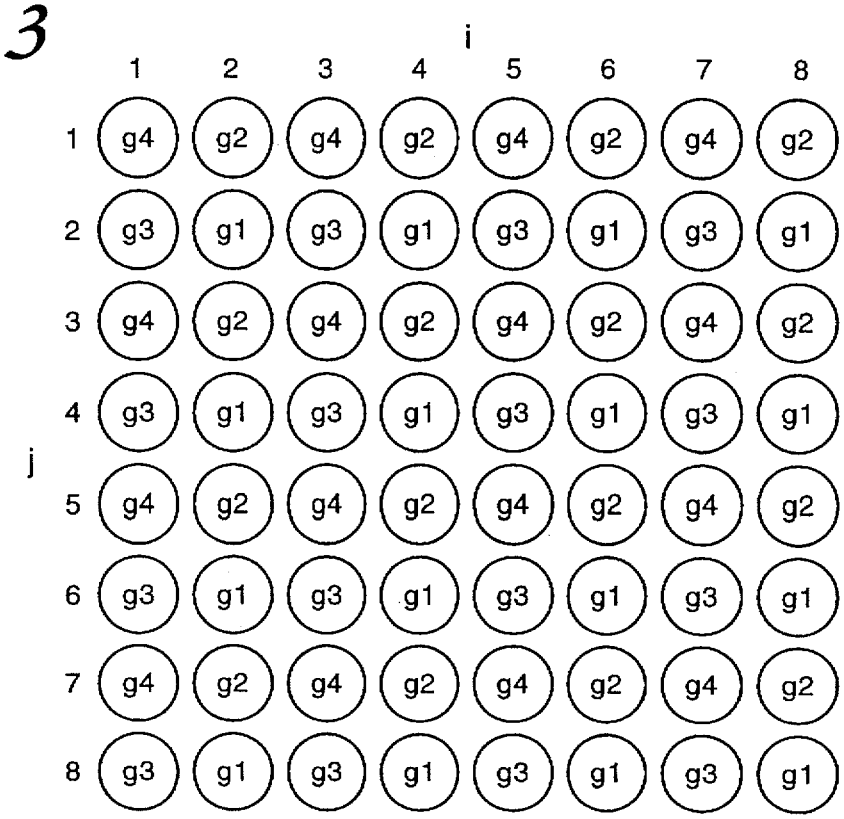
FIG. 3 is a plan view of the unit capacitances in the initial condition of a third embodiment.

FIG. 3 is a plan view of an arrangement of unit capacitances for obtaining a capacity ratio of 32:16:8:4:2:1:1 in a square area of 8×8 unit capacitances. Here, when a capacity of a unit capacitance is Cu, a capacity of a capacitance component with the maximum capacity is defined as 32 Cu, and the capacitances following to the maximum are defined as 16 Cu, 8 Cu, 4 Cu, 2 Cu and Cu. Furthermore, a capacity is defined as a reference capacity of Cu. In order to designate unit capacitances for capacity definition, following steps are performed:

STEP 1

Figure 4:
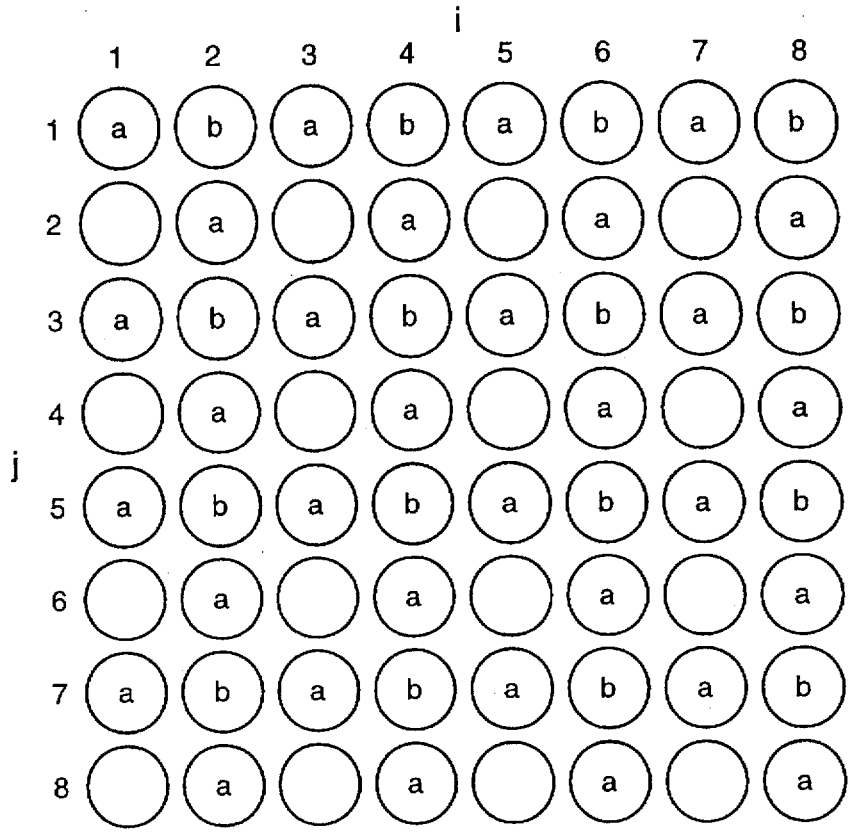
FIG. 4 is a plan view of unit capacitances for the most significant and the second significant bit of a binary number.

FIG. 3 shows an arrangement of unit capacitances with coordinates 'i' of the horizontal direction and 'j' of the vertical direction 'j'. When a group G of all unit capacitances is defined as G={xij}, four subsets can be defined, that is, g1={xij|i=even, j=even}, g2={xij|i=even, j=odd}, g3={xij|i=odd, j=even}, g4={xij|i=odd, odd}. Furthermore, a sum of subsets g1 and g4 is defined as g5, and a sum of subsets g2 and g3 is defined as g6. The subset g5 or g6 is designated as unit capacitances for the capacitance component of most significant bit (MSB). FIG. 4 shows an arrangement of g5, and unit capacitances of the MSB are designated by a reference 'a'. This arrangement can be called 'zigzag arrangement'.

STEP 2

In step 2, unit capacitances for the second bit from the MSB is selected. Since g5 is selected in step 1, unit capacitances included in g6 are selected in step 2. The subset g2 or g3 is selected. FIG. 2 shows a condition that g2 is selected and the selected unit capacitance is shown by a reference 'b'. If g6 were selected, g1 or g4 would be selected.

STEP 3

In step 3, unit capacitances are shown without references which are not selected in the step 2, as shown in FIG. 4.

Then, new coordinates of the arrangement is given to the non-selected unit capacitances, and processes are repeated beginning at step 1.

STEP 4

Figure 5:
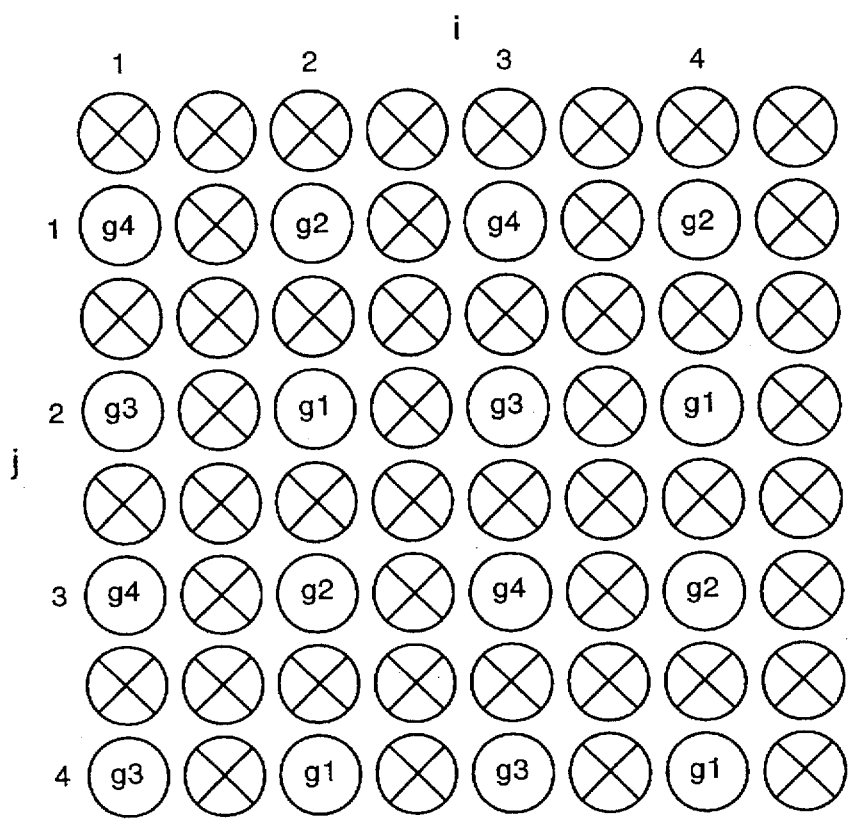
FIG. 5 is a plan view of a group of capacitances newly defined after the condition in FIG. 4.
Figure 6:
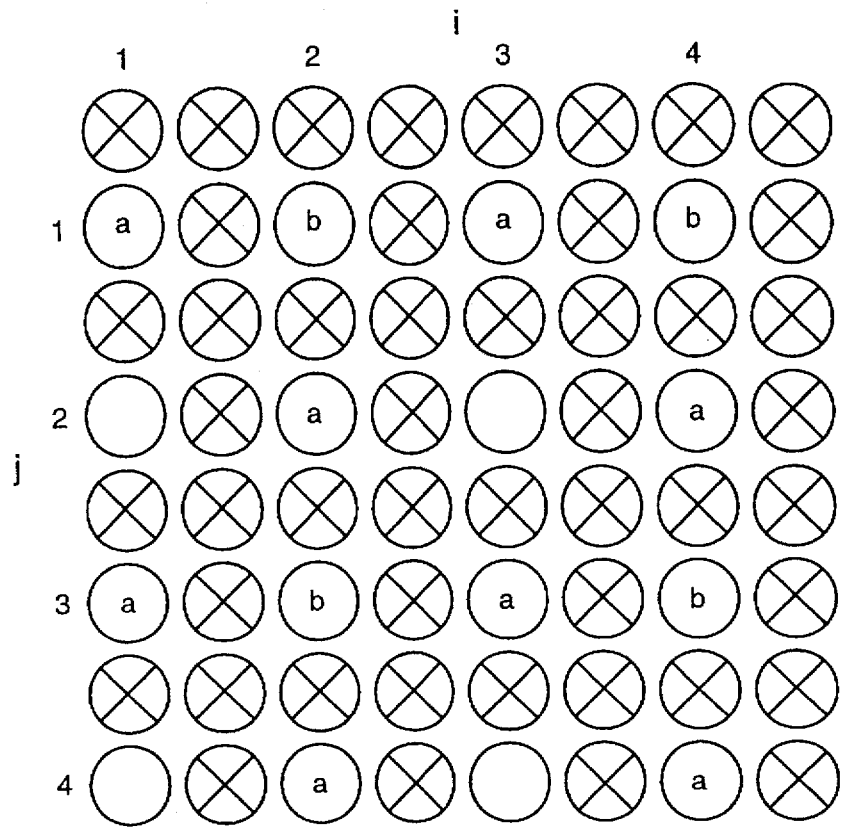
FIG. 6 is a plan view illustrating the selection of unit capacitances for the third and fourth bits according to the order defined in FIG. 5.

FIG. 5 shows new coordinates "i" (horizontal direction) and "j" (vertical direction) for non-selected 16 unit capacitances, and the subset mentioned above is defined (selected unit capacitance is shown by x). The total set G={xij}, and subsets g1={xij|i=even, j=even}, g2={xij|i=even, j=odd}, g3={xij|i=odd, j=even}, g4={xij|i=odd, odd}, g5=g1∪g4 and g6=g2∪g3, as shown in FIG. 3. Similar to the step 1, g5 or g6 is selected to be the third bit from the MSB, which is the most significant bit among the bits undefined. FIG. 6 shows an arrangement when g5 is selected, unit capacitances for the third bit is shown by 'a'. In FIG. 6, the selected unit capacitances are shown by x.

STEP 5

Similar to the step 2, g2 is selected to be the forth bit. In FIG. 6, four unit capacitances for the forth bit is shown by a reference 'h'.

STEP 6

Figure 7:
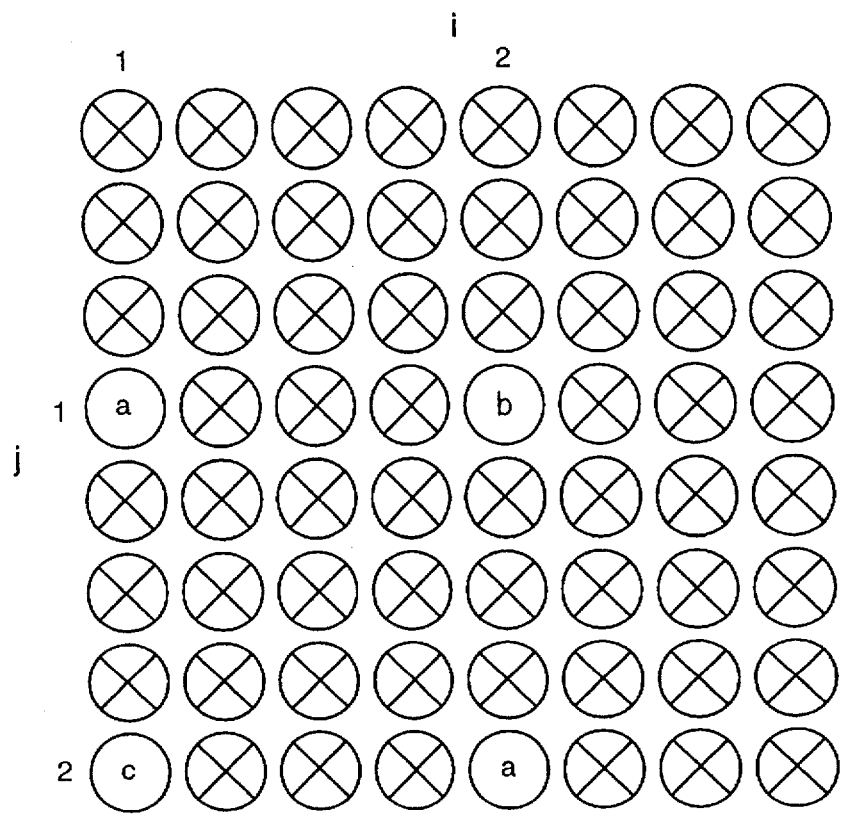
FIG. 7 is plan view showing a new order and selection of unit capacitances for a fifth bit, the least significant bit and the reference capacitance according to the order defined after the selection of FIG. 6.

Similar to the step 3, now coordinates are given for non-selected unit capacitances, as shown in FIG. 7.

STEP 7

Four unit capacitances remained. Similar to the steps 1 and 4, new coordinates are defined, as follows: G={x11, x12, x21, x22}, g1={x22}, g2={x21}, g3={x12}, g4={x11}, g5={x22,x11}, g6={x21,x12} (selected unit capacitances are shown by X). The subset g5 is selected and two unit capacitances for the 5th bit are selected.

STEP 8

Similar to the 5, g2={x21} is selected as an unit capacitance for the sixth bit. FIG. 7 shows the unit capacitances by a reference 'b'.

STEP 9

Non-selected unit capacitances exist as unit capacitances for a reference capacitance, then the total assignments are completed.

As mentioned above, by applying the zigzag arrangement and rectangle arrangement of the unit capacitances one after another, unit capacitances for each capacitance are equally dispersed. Deviation of capacities due to positioning partiality is solved and high relative accuracy is obtained.

The above steps are generalized by the following steps G1 to G3.

STEP G1

A subset of non-selected unit capacitances is defined as G={xij}("i" and "j" are coordinates of horizontal and vertical directions), g1={xij|i=even, j=even}, g2={xij|i=even, j=odd}, g3={xij|i=odd, j=even}, g4={xij|i=odd, odd}, g5=g1∪g4, and g6=g2∪g3. The subset g5 or g6 is selected to be unit capacitances of the MSB.

STEP G2

When g5 is selected in step 1, then g2 or g3 is selected to be unit capacitances for the highest bit after the selection of unit capacitances for the MSB. When g6 is selected, g1 or g4 is selected.

STEP G3

When, in this stage, weights of the LSB and the reference are not defined by the unit capacitances, the half of non-selected unit capacitances are assigned to LSB and the others are assigned to the reference. Otherwise, new coordinates are given to the all non-selected unit capacitances, such as {xij}, and the steps from G1 to G3 are repeated.

In the embodiment above, the LSB and reference capacitance are defined by single unit capacitance, respectively. However, it is possible to defined them using a plurality of unit capacitances. When this number of unit capacitances is L, the weight of the MSB is Wm, the weight of the LSB is Wl and the total number of unit capacitances is N, Formulas 1 to 3 are defined.

$$Wm = 2^k \quad (1)$$

$$Wl = Cu \times L \quad (2)$$

$$N = 2^{K+1} \times L \quad (3)$$

Then, the unit capacitances are designated for each weight according to the generalized steps G1 to G3, as follows: number of unit capacitances for MSB $$2^k \times L \quad (4)$$

number of unit capacitances for the second bit:

$$2^{K-1} \times L \quad (5)$$

number of unit capacitances for the nth bit:

$$2^{K-n+1} \times L \quad (6)$$

number of unit capacitances for LSB:

$$L \quad (7)$$

number of unit capacitances for the reference capacitance:

$$L \quad (8)$$

Then, the equivalent dispersion of unit capacitances is realized.

In the case where the total number of unit capacitance is relatively large, enough relative accuracy is obtained even if the above mentioned rules are not applied to LSB and the reference capacity. According to experience, less than 10% of the total of 128 unit capacitances can be wired independently from the rule above without deteriorating the relative accuracy of capacities. When the total number is in the range of 256 with 10% unit capacitances out of rule, extremely high relative accuracy is guaranteed. It is advantageous that some capacitances are wired according to simplicity or efficiency than to the rule above with keeping accuracy in capacity.

Hereinafter the fourth embodiment of a capacitance forming method according to the present invention is described with reference 00 to the attached drawings.

Figure 8:
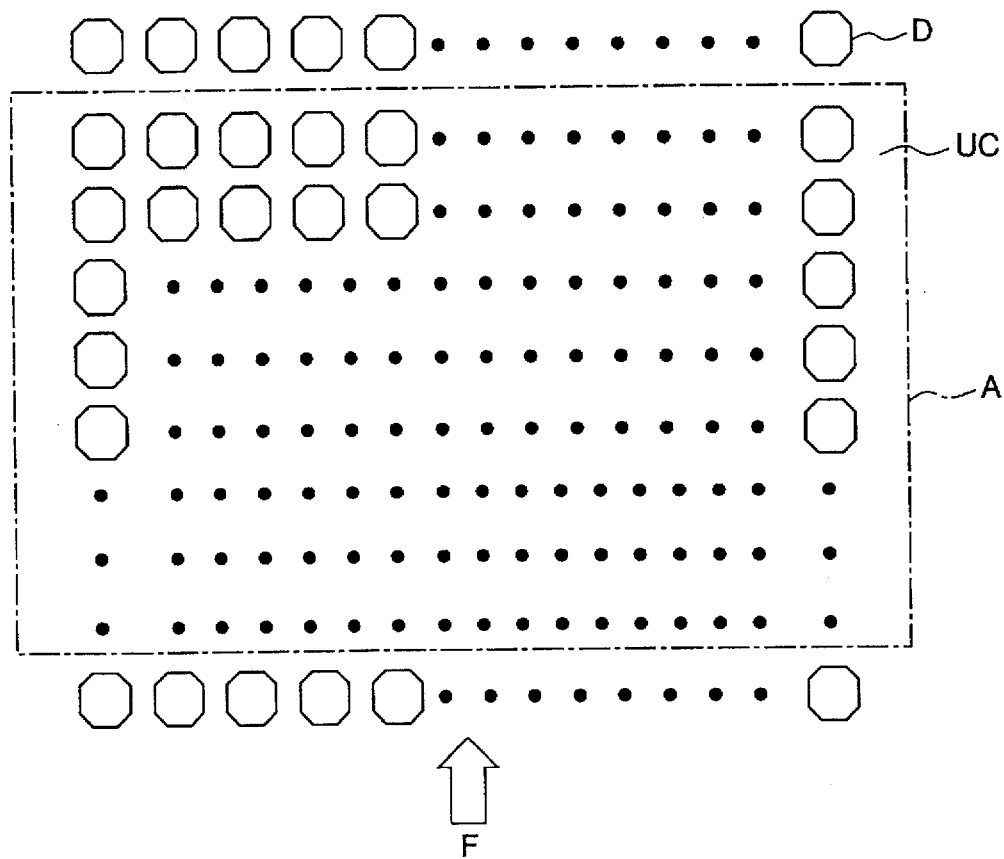
FIG. 8 is a plan view of a fourth embodiment.

In FIG. 8, unit capacitances UC are arranged in rectangular area A, and flow F of diffusion of chemical vapor flows to the direction F across the area A (it is shown by an arrow). The unit capacitances UC and dummy patterns Ds similar to the unit capacitances are arranged along the sides of area A perpendicular to the flow. The dummy patterns prevent excessive erosion or any other bad influences to the unit capacitances caused by the flow.

Since the dummy patterns have the same shape as the unit capacitances, the influence of the dummy pattern on the unit capacitance is substantially equal to that of adjacent unit capacitances. For the dummy pattern, unit capacitance pattern without wiring can be used as it is and it is not necessary to use a new pattern. It is also possible so surround all the sides of unit with a capacitances.

Figure 9:
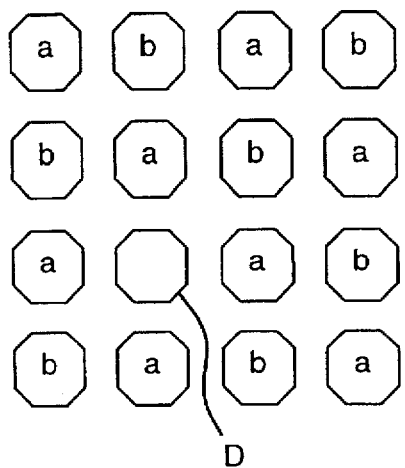
FIG. 9 is a plan view of a fifth embodiment.
Figure 10:
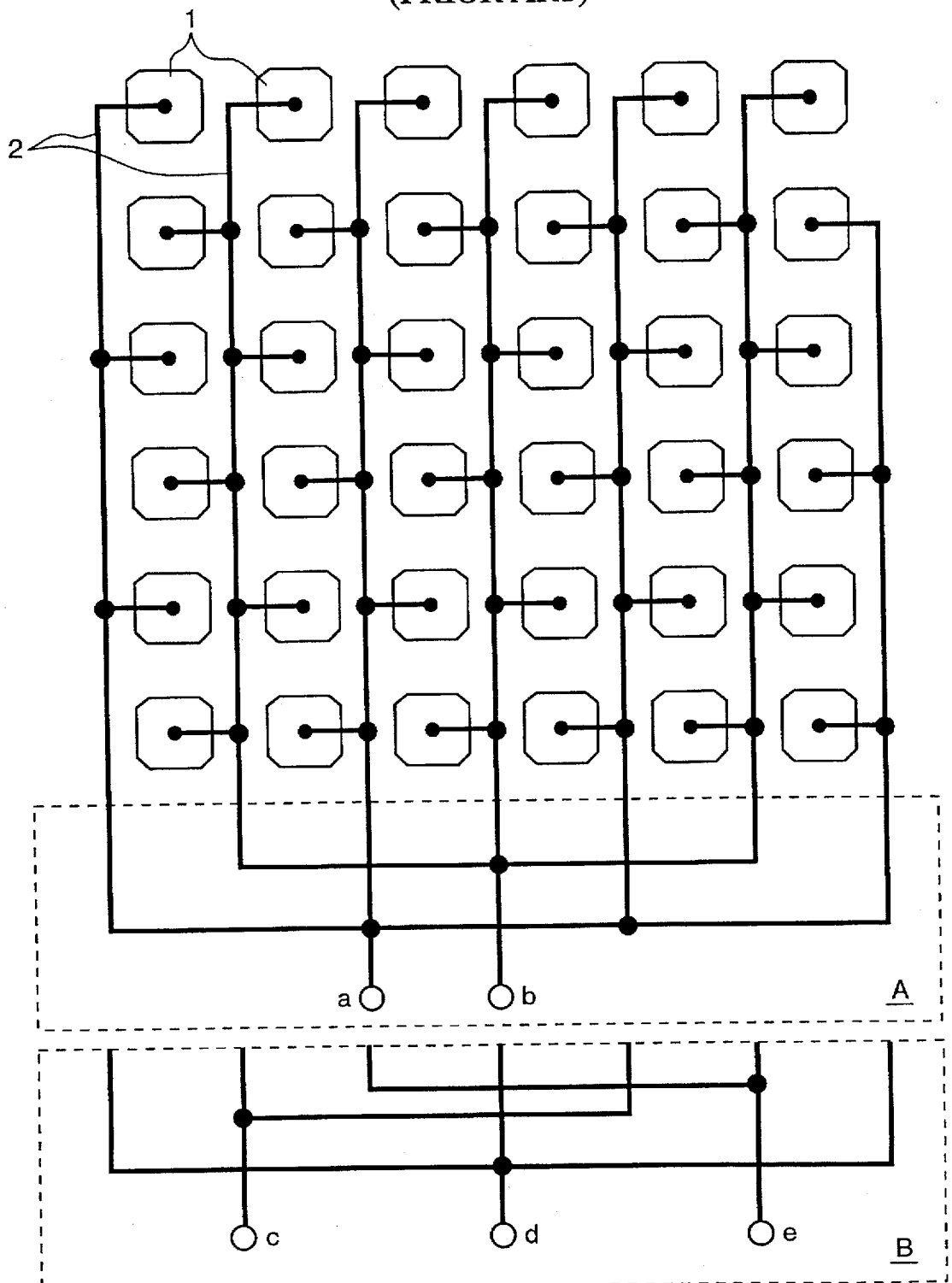
FIG. 10 is a circuit diagram showing the unit capacitance arrangement proposed in another patent application.

FIG. 9 shows the fifth embodiment of a square arrangement of 4×4 patterns including a plurality of unit capacitances "a" and "b" and a dummy pattern "D". A capacitance component of 8 unit capacitances consists of the unit capacitances "a", and a capacitance component of 7 unit capacitances consists of the unit capacitances "b". These capacitance components have unit capacitances a little less or more for shaping a rectangle. If they are arranged in 2-dimensional area, it becomes irregular form. The dummy pattern D controls the excess and lack, and it is possible to make arrangement of rectangle or square.

By arranging unit capacitances in regular form, a condition when unit capacitance is formed is equal, and equality of unit capacitance is guaranteed. Dummy pattern D can be formed as a pattern without wiring, but it is preferable to short-circuit the opposite electrodes for preventing electric charge from building up after forming the dummy pattern.

What is claimed is:

1. A capacitance forming method for forming a plurality of capacitance components from a plurality of unit capacitances within a large scale integrated circuit (LSI) comprising steps of:

providing a plurality of unit capacitances in a first area of said LSI, each unit capacitance having a predetermined shape, wherein a sufficient number of said unit capacitances are provided so that a total capacitance of said unit capacitances in said first area is at least as great as a total capacitance of said plurality of capacitance components;

selecting a first group of said unit capacitances to define a largest capacitance component from among said plurality of capacitance components, said unit capacitances being selected such that unit capacitances included in said first group of unit capacitances are equivalently dispersed over said first area;

selecting another group of said unit capacitances to define a largest capacitance component remaining from among said plurality of capacitance components, said unit capacitances being selected such said unit capacitances included in said another group of unit capacitances are equivalently dispersed over a portion of said first area defined by said unit capacitances which have not yet been selected to define a capacitance component; and repeating said step of selecting another group of said unit capacitances until all of the plurality of capacitance components are defined by at least one unit capacitance.

2. A capacitance forming method as claimed in claim 1, wherein each capacitance component corresponds to a weight of a bit of a binary number, said unit capacitances are provided in a rectangular configuration, and said first group of unit capacitances are arranged without any adjacent pairs of unit capacitances in a horizontal or vertical direction.

3. A capacitance forming method as claimed in claim 2, wherein one capacitance component in said plurality of capacitance components corresponds to a reference number equal to a least significant bit of said binary number, said method further comprising steps of:

(1) defining coordinates (i,j) along both sides of a rectangle encompassing said unit capacitances, wherein a set of all unit capacitances that are not used to define a capacitance component is identified as G={xij}, and subsets of said unit capacitances that are not used to define a capacitance component are identified as g1={xij|i:even,j:even}, g2={xij|i:even,j:odd}, g3={xij|i:odd,j:even}, g4={xij|i:odd,j:odd}, g5=g1∪g4, and g6=g2∪g3;

(2) selecting one of g5 and g6 as a group or unit capacitances defining a capacitance component associated with a most significant bit from among bits of said binary number for which a capacitance component has not yet been defined by said unit capacitances;

(3) if g5 is selected, selecting g2 as a group of unit capacitances defining a capacitance component associated with a most significant bit of said binary number for which a capacitance component has not yet been defined by said unit capacitances, if g5 is not selected, selecting one of g1 and g4 as a group of unit capacitances defining a capacitance component associated with said most significant bit of said binary number for which a capacitance component has not yet been defined by said unit capacitances; and (4) if capacitance components associated with each bit of said binary number other than a least significant bit and a capacitance component associated with said reference number are already defined by said unit capacitances, assigning a remainder of said unit capacitances that are not being used to define a capacitance component such that said remainder of said unit capacitances are equally divided such that half define a capacitance component associated with said least significant bit and half define a capacitance component associated with said reference number;

(5) if capacitance components associated with each bit of said binary number other than a least significant bit and a capacitance component associated with said reference number are not already defined by said unit capacitances, defining new coordinates (i,j) for remaining said unit capacitances that are not being used to define a capacitance component and return to step 1 to repeat steps 1–5.

4. A capacitance forming method as claimed in claim 3, further comprising:

selecting predetermined capacitance components associated with low bits of said binary number for which unit capacitance have not yet been assigned; and assigning remaining unit capacitances to said predetermined capacitance components.

5. A capacitance forming method as claimed in claim 4, wherein a number of said unit capacitances used to define said capacitance components associated with said low bits is 10% of a total number said unit capacitances.

6. A capacitance forming method for forming a plurality of capacitance components from a plurality of unit capacitances within a large scale integrated circuit (LSI) comprising steps of:

providing a plurality of unit capacitances in a first area of said LSI, each unit capacitance having a predetermined shape, wherein a sufficient number of said unit capacitances are provided so that a total capacitance of said unit capacitances in said first area is at least as great as a total capacitance of said plurality of capacitance components; and forming dummy patterns having substantially a same shape as said unit capacitances in at least a part of a peripheral area of said first area, said dummy patterns not being connected with any other electrical elements and comprising electrodes disposed is a face-to-face opposing relation spaced apart from one another with a short circuit being provided between opposing electrodes.

7. A capacitance forming method as claimed in claim 6, wherein said peripheral area is an area elongated in a direction substantially perpendicular to a diffusion flow of a chemical vapor.

8. A capacitance forming method for forming a plurality of capacitance components from a plurality of unit capacitances within a large scale integrated circuit (LSI) comprising steps of:

providing a plurality of unit capacitances in a first area of said LSI, each unit capacitance having a predetermined shape, wherein a sufficient number of said unit capacitances are provided so that a total capacitance of said unit capacitances in said first area is at least as great as a total capacitance of said plurality of capacitance components; and forming dummy patterns at vacant positions in said first area where no unit capacitance is used to define a capacitance component to enable said plurality of capacitance components to be arranged in a geometric shape, said dummy patterns having a substantially same shape as said unit capacitances and not being connected to any other electrical component, said dummy patterns comprising electrodes disposed is a face-to-face opposing relation spaced apart from one another with a short circuit being provided between opposing electrodes.

\* \* \* \* \*